United States Patent
La et al.

(10) Patent No.: US 12,088,062 B1
(45) Date of Patent: Sep. 10, 2024

(54) OPTICAL FREQUENCY STABILIZATION APPARATUS FOR NARROW SPECTRAL LINEWIDTH LASER GENERATION

(71) Applicant: Lambda innoVision Inc., Hwaseong-si (KR)

(72) Inventors: Jong Pil La, Hwaseong-si (KR); Ji Eun Choi, Hwaseong-si (KR)

(73) Assignee: Lambda innoVision Inc., Hwaseong-si (KR)

( * ) Notice: Subject to any disclaimer, the term of this patent is extended or adjusted under 35 U.S.C. 154(b) by 0 days.

(21) Appl. No.: 18/656,709

(22) Filed: May 7, 2024

(30) Foreign Application Priority Data

May 11, 2023 (KR) .......................... 10-2023-0060811

(51) Int. Cl.
*H01S 5/0687* (2006.01)
*H01S 3/04* (2006.01)
(Continued)

(52) U.S. Cl.
CPC .......... *H01S 5/0687* (2013.01); *H01S 3/0405* (2013.01); *H01S 3/10015* (2013.01); *H01S 3/1305* (2013.01); *H01S 3/131* (2013.01); *H01S 5/0064* (2013.01); *H01S 5/02438* (2013.01); *H01S 5/14* (2013.01)

(58) Field of Classification Search
CPC .. H01S 5/0687; H01S 3/0405; H01S 3/10015; H01S 3/1305; H01S 3/131; H01S 5/0064; H01S 5/02438; H01S 5/14
See application file for complete search history.

(56) References Cited

U.S. PATENT DOCUMENTS

| | | | |
|---|---|---|---|
| 2010/0085992 A1* | 4/2010 | Rakuljic | G01S 7/4911 372/20 |
| 2019/0025431 A1* | 1/2019 | Satyan | G01S 7/4914 |
| 2019/0229494 A1* | 7/2019 | Idjadi | G02F 1/00 |

FOREIGN PATENT DOCUMENTS

| CN | 108702085 A | * 10/2018 | H02M 1/08 |
|---|---|---|---|
| JP | H11101922 A | 4/1999 | |

(Continued)

OTHER PUBLICATIONS

Office Action of Korean Patent Application No. 10-2023-0060811 dated Jul. 4, 2023.

*Primary Examiner* — Yuanda Zhang
(74) *Attorney, Agent, or Firm* — Dinsmore & Shohl LLP; Yongsok Choi, Esq.

(57) ABSTRACT

A laser generation apparatus includes a light source making oscillate a laser having a frequency based on the amount of current applied thereto, a splitter ramifying a laser incident thereon at a preset ratio, an interference system receiving the ramified laser, generating an interference signal by ramifying a laser incident thereon, and measuring the phase of a laser oscillated, a temperature adjustment unit uniformly maintaining a temperature of a part of the interference system, an error integrator receiving a signal that has undergone the interference system and accumulating a phase error occurred, a phase error detection unit detecting a phase difference between the signal of the error integrator and an offset current value, a driving driver applying a current to the light source, and a control unit controlling an operation of each component and controlling the driving driver based on results of the detection of the phase error detection unit.

9 Claims, 3 Drawing Sheets

(51) Int. Cl.
*H01S 3/10* (2006.01)
*H01S 3/13* (2006.01)
*H01S 3/131* (2006.01)
*H01S 5/00* (2006.01)
*H01S 5/024* (2006.01)
*H01S 5/14* (2006.01)

(56) References Cited

FOREIGN PATENT DOCUMENTS

| | | | | | |
|---|---|---|---|---|---|
| KR | 100819239 | B1 | | 4/2008 | |
| KR | 101642952 | B1 | | 7/2016 | |
| KR | 20220110016 | A | * | 8/2022 | ............. G01S 17/32 |
| KR | 1020230032196 | A | | 3/2023 | |
| WO | 2004064209 | A1 | | 7/2004 | |

\* cited by examiner

OPTICAL FREQUENCY STABILIZATION APPARATUS FOR NARROW SPECTRAL LINEWIDTH LASER GENERATION

CROSS-REFERENCE TO RELATED APPLICATION

The present application claims priority under 35 U.S.C. § 119 (a) to Korean Patent Application No. 10-2023-0060811, filed in the Korean Intellectual Property Office on May 11, 2023, the entire disclosure of which is incorporated herein by reference.

This patent application is the results of research that was carried out by the support (a unique project number: 1415187768, a detailed project number: 20024096, a project name: The development of volume 300 cc less-Solid State FMCW LiDAR for an autonomous robot for handling a poor indoor and outdoor driving environment (e.g., snow, smoke, or dust)) of the Korea Planning & Evaluation Institute of Industrial Technology by the finances of the government of the Republic of Korea (The Ministry of Trade, Industry and Energy). Furthermore, this patent application is the results of research that was carried out by the support (a unique project number: 1425177505, a detailed project number: S3364883, a project name: the development of an ultra-small FMCW LiDAR sensor for an autonomous vehicle based on an optical semiconductor) of the Korea Technology and Information Promotion Agency for SMEs by the finances of the government of the Republic of Korea (The Ministry of Small and Medium-sized Enterprises and Startups).

BACKGROUND

1. Technical Field

The present disclosure relates to a laser generation apparatus capable of stabilizing optical frequency characteristics of a laser.

2. Related Art

Contents described in this part merely provide background information of the present embodiment, and do not constitute a conventional technology.

A light source having a narrow Spectral linewidth is used in several science and technology fields, such as coherent optical communication, a high resolution LIDAR system, and the generation, sensing, or spectroscopy of millimeter wave and terahertz signals.

A system that is used in coherent optical communication adopts a very complicated modulation method. Such a modulation method requires a high bit error rate (BER). Accordingly, there is a need for a laser that stably operates and that has a Spectral linewidth as narrow as possible.

An external cavity laser diode has a relatively narrow Spectral linewidth compared to other lasers, but is very sensitive to environmental factors, such as a temperature change, a pressure change, and mechanical vibration. It is difficult for the external cavity laser diode to be used without a proper isolation mechanism from external disturbances because the Spectral linewidth of the external cavity laser diode is widened due to such environmental factors.

A conventional laser generation apparatus has solved such a problem by using the following method. The frequency shift of a light source is measured by using a frequency discriminator, such as Fabry-Perot Etalon. The frequency shift is reduced by changing a current that is injected into the light source.

However, it is difficult to apply such a method to a case in which a change of the driving conditions is not easy because driving conditions for a light source are changed due to an error signal of the frequency discriminator or a case in which a frequency change is not accompanied even in a change of the driving conditions. In other words, such a method may be applied to only a semiconductor laser in which an oscillation frequency can be easily changed depending on a change in the driving conditions.

Accordingly, there is a demand for a laser generation apparatus capable of simply measuring and stabilizing frequency characteristics of a laser that will oscillate.

SUMMARY

An embodiment of the present disclosure is directed to providing a laser generation apparatus capable of accurately measuring and stabilizing optical frequency characteristics of a laser that will oscillate even through a simple structure.

According to an aspect of the present disclosure, a laser generation apparatus includes a light source configured to make oscillate a laser having a frequency that complies with the amount of current, based on the amount of the current that is applied thereto, a splitter configured to ramify a laser that is incident thereon at a preset ratio, an interference system configured to receive the ramified laser from the splitter, to generate an interference signal by ramifying a laser that is incident thereon, and to measure the phase of a laser that has oscillated, a temperature adjustment unit configured to uniformly maintain a temperature of a part of the interference system, an error integrator configured to receive a signal that has undergone the interference system and to accumulate a phase error that has occurred, a phase error detection unit configured to detect a phase difference between the signal that has undergone the error integrator and an offset current value, a driving driver configured to apply a current to drive the light source to the light source, and a control unit configured to control an operation of each component within the laser generation apparatus and to control the driving driver based on results of the detection of the phase error detection unit.

According to an aspect of the present disclosure, the laser generation apparatus further includes an isolator disposed between the splitter and the light source on a light path and configured to prevent the laser that is made to oscillate by the light source from being reflected back to the light source.

According to an aspect of the present disclosure, the splitter outputs some of the laser that is incident thereon to the outside and advances the remaining laser toward the interference system.

According to an aspect of the present disclosure, the preset ratio is 99:1 on the basis of the laser that is output to the outside and a laser that proceeds to the interference system.

According to an aspect of the present disclosure, the interference system is implemented as a Mach-Zender interference system.

According to an aspect of the present disclosure, the interference system more delays any one path, among paths through which the ramified lasers are to pass, than other paths.

According to an aspect of the present disclosure, the temperature adjustment unit uniformly maintains a temperature of a portion that has been more delayed than another path within the interference system.

According to an aspect of the present disclosure, the temperature adjustment unit is disposed to come into contact with a part of the interference system or disposed within a set radius of the interference system.

According to an aspect of the present disclosure, the laser generation apparatus further includes a first amplifier configured to receive an electrical signal that is output by the interference system and to convert the electrical signal into a voltage signal.

According to an aspect of the present disclosure, the laser generation apparatus further includes a second amplifier configured to receive the voltage signal converted by the first amplifier and to adjust a gain of a circuit within the laser generation apparatus.

As described above, according to an aspect of the present disclosure, there is an advantage in that frequency characteristics of a laser that will oscillate can be accurately measured and stabilized even through a simple structure.

DETAILED DESCRIPTION

Figure 1:
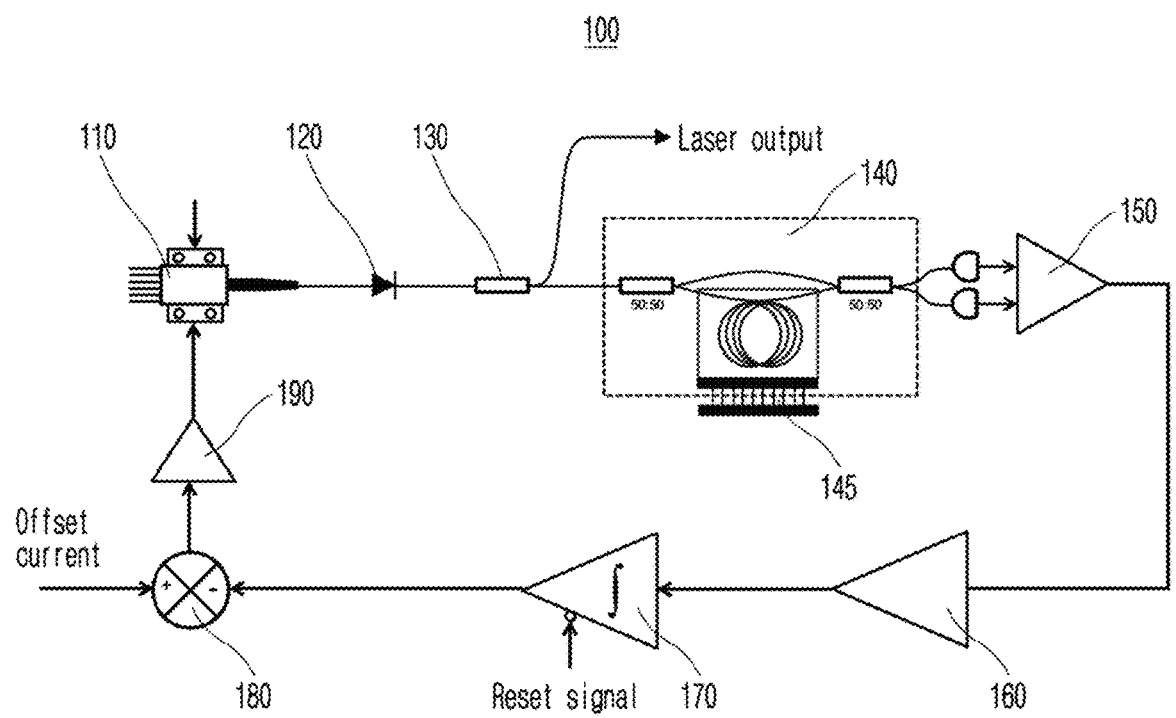
FIG. 1 is a diagram illustrating a construction of a laser generation apparatus according to an embodiment of the present disclosure.

The present disclosure may be changed in various ways and may have various embodiments. Specific embodiments are to be illustrated in the drawings and specifically described. It should be understood that the present disclosure is not intended to be limited to the specific embodiments, but includes all of changes, equivalents and/or substitutions included in the spirit and technical range of the present disclosure. Similar reference numerals are used for similar components while each drawing is described.

Terms, such as a first, a second, A, and B, may be used to describe various components, but the components should not be restricted by the terms. The terms are used to only distinguish one component from another component. For example, a first component may be referred to as a second component without departing from the scope of rights of the present disclosure. Likewise, a second component may be referred to as a first component. The term "and/or" includes a combination of a plurality of related and described items or any one of a plurality of related and described items.

When it is described that one component is "connected" or "coupled" to the other component, it should be understood that one component may be directly connected or coupled to the other component, but a third component may exist between the two components. In contrast, when it is described that one component is "directly connected to" or "directly coupled to" the other component, it should be understood that a third component does not exist between the two components.

Terms used in this application are used to only describe specific embodiments and are not intended to restrict the present disclosure. An expression of the singular number includes an expression of the plural number unless clearly defined otherwise in the context. In this specification, a term, such as "include" or "have", is intended to designate the presence of a characteristic, a number, a step, an operation, a component, a part or a combination of them, and should be understood that it does not exclude the existence or possible addition of one or more other characteristics, numbers, steps, operations, components, parts, or combinations of them in advance.

All terms used herein, including technical terms or scientific terms, have the same meanings as those commonly understood by a person having ordinary knowledge in the art to which the present disclosure pertains, unless defined otherwise in the specification.

Terms, such as those defined in commonly used dictionaries, should be construed as having the same meanings as those in the context of a related technology, and are not construed as ideal or excessively formal meanings unless explicitly defined otherwise in the application.

Furthermore, each construction, process, procedure, or method included in each embodiment of the present disclosure may be shared within a range in which the constructions, processes, procedures, or methods do not contradict each other technically.

FIG. 1 is a diagram illustrating a construction of a laser generation apparatus according to an embodiment of the present disclosure.

Referring to FIG. 1, a laser generation apparatus 100 according to an embodiment of the present disclosure includes a light source 110, an isolator 120, a splitter 130, an interference system 140, a temperature adjustment unit 145, a first amplifier 150, a second amplifier 160, an error integrator 170, a phase error detection unit 180, a driving driver 190, and a control unit (not illustrated).

The laser generation apparatus 100 is mounted and used in an apparatus that has to make a laser having a uniform frequency oscillate, such as a LIDAR system. The laser generation apparatus 100 operates to autonomously determine whether the frequency of a laser that oscillates has a preset frequency and error and to minimize an error by analyzing how much error occurs therefrom. The laser generation apparatus 100 relatively accurately analyzes a frequency error even through a simple structure, and makes a laser having a desired frequency oscillate.

The light source 110 makes a laser having a proper frequency oscillate based on the amount of current that is applied by the driving driver 190. The light source 110 makes a laser having a constant frequency oscillate. When the amount of current that is applied from the driving driver 190 to the light source 110 is changed, the frequency of a laser that is made to oscillate by the light source 110 is also changed in proportion to the change. The light source 110 receives the amount of current that is fed back by the driving driver 190, and makes oscillate a laser having a frequency that complies with the amount of current.

The isolator 120 is disposed between the splitter 130 and the light source 110 on a light path, and prevents a laser that has been made to oscillate by the light source 110 from being reflected back to the light source 110 again. The laser that has been made to oscillate by the light source 110 may be reflected back toward the light source 110 while undergoing the splitter 130. If the laser is reflected back to the light source 110 again as described above, the light source 110 may be adversely affected. The isolator 120 is disposed at the aforementioned location, and blocks the progress of light that is reflected from the splitter 130 back to the light source 110.

The splitter 130 ramifies a laser that is incident thereon at a preset ratio. The splitter 130 outputs a part of the laser that is incident thereon to the outside, and advances the remainder toward the interference system 140. In this case, the preset ratio may be about 99:1 on the basis of a laser that is output and a laser that proceeds to the interference system 140. The splitter 130 outputs most of the laser, and ramifies some laser into the interference system 140 for the adjustment of a frequency.

The interference system 140 measures the phase of a laser that has oscillated. The interference system 140 may be implemented as a Mach-Zender interference system. The interference system 140 ramifies a laser that is incident thereon into two or more lasers, and more delays any one path, among paths through which the ramified lasers will pass, than other paths. Thereafter, the interference system 140 generates an interference signal by making the ramified lasers interfere with each other. A degree that the path has been delayed is an already known numerical value. Accordingly, if a laser that has been made to oscillate by the light source 110 has been made to oscillate at a designed frequency without any change, the phase of an interference signal that has been made to interfere while undergoing the interference system 140 needs to have a preset value. The frequency of the laser that has been made to oscillate by the light source 110 has a good possibility that the frequency will be changed by various causes. If the frequency of the laser that has been made to oscillate is changed from the designed frequency as described above, the phase of the interference signal has an error from the preset value. The interference system 140 generates the interference signal of the laser that has oscillated so that the phase error detection unit 180 and the control unit (not illustrated) can determine whether the frequency of the laser that has been made to oscillate has been changed and perform the adjustment of the frequency by analyzing the error.

The interference system 140 converts an interference signal into an electrical signal and transmits the electrical signal to the first amplifier 150.

The temperature adjustment unit 145 uniformly maintains a temperature of the interference system 140, in particular, a temperature of a portion the path of which within the interference system 140 has been delayed. The temperature adjustment unit 145 is disposed to come into contact with the aforementioned portion within the interference system 140 or disposed close to the aforementioned portion, and maintains the temperature of the corresponding portion to a preset temperature. For example, the temperature adjustment unit 145 may be implemented as a thermoelectric module (TEC). When the temperature is changed, although the physical length of a light path is not changed, the optical length of the light path is changed because a refractive index within the light path is changed. When the optical length of a delayed portion within the interference system 140 is changed due to the temperature change, a frequency change of the frequency of a laser that has been actually made to oscillate and a change in the phase of an interference signal are not proportional to each other. That is, although the control unit (not illustrated) controls the amount of current that is applied to the light source 110 based on a change value by analyzing a change in the phase of the interference signal, there is a difference between the frequency of a laser that is output by the light source 110 and a designed frequency due to the change value. The temperature adjustment unit 145 prevents the aforementioned problem by uniformly maintaining a temperature of a portion the path of which within the interference system 140 has been delayed. Accordingly, the frequency of the laser that is made to oscillate by the light source 110 can be accurately adjusted based on the designed frequency.

The first amplifier 150 receives an electrical signal that is output by the interference system 140, and converts the electrical signal into a voltage signal. The first amplifier 150 is implemented as a trans-impedance amplifier (TIA), and may perform the aforementioned operation.

The second amplifier 160 receives a voltage signal converted by the first amplifier 150 and adjusts the gain of a circuit within the laser generation apparatus 100. If the gain of the circuit within the laser generation apparatus 100 becomes excessively small, there is a problem in that an error is increased. If the gain becomes excessively great, there is a possibility that a laser will oscillate without any change. Accordingly, the second amplifier 160 adjusts the gain of the voltage signal converted by the first amplifier 150 at a preset reference value level.

The error integrator 170 receives a voltage signal that has undergone the second amplifier 160, and accumulates a (phase) error that has occurred. A detailed structure and operation cause of the error integrator 170 are illustrated in FIGS. 2A, 2B and 3.

Figure 2A:
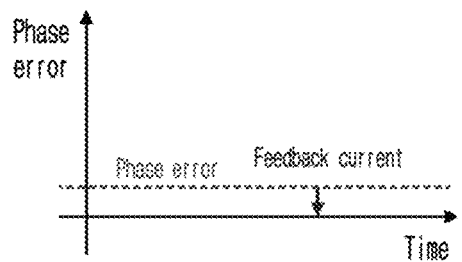
FIGS. 2A and 2B are graphs illustrating the size of a phase error and the size of a feedback current that will be applied based on the size of the phase error.
Figure 2B:
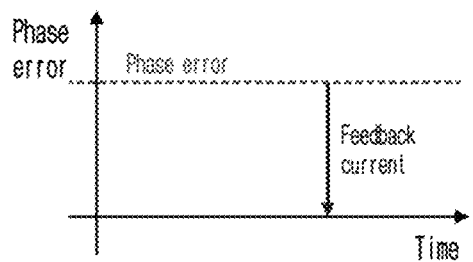
Figure 3:
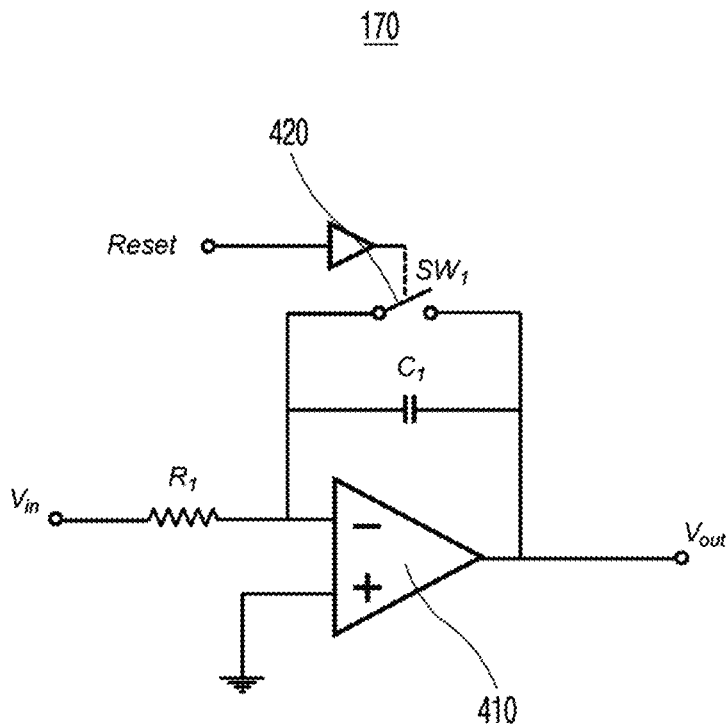
FIG. 3 is a diagram illustrating a construction of an error integrator according to an embodiment of the present disclosure.

FIGS. 2A and 2B are graphs illustrating the size of a phase error and the size of a feedback current that will be applied based on the size of the phase error. FIG. 3 is a diagram illustrating a construction of the error integrator according to an embodiment of the present disclosure.

As illustrated in FIGS. 2A and 2B, the size of a phase error and the size of a feedback current to be applied are proportional to each other. That is, as the size of the phase error increases, the size of the feedback current also increases proportionally. As the size of the phase error decreases, the size of the feedback current also decreases proportionally. In this case, when the size of the phase error decreases (less than a preset reference value), there is a problem in that accuracy is reduced because an operation for the reference value for solving the phase error and the size of the feedback current according to a current phase of an interference signal becomes more sensitive and finer. Furthermore, a relatively long time is taken for the feedback current to be incorporated into the light source 110 because the size of the feedback current decreases. Rather, when the size of the phase error increases (the preset reference value or more), a difference between the reference value for solving the phase error and the size of the feedback current according to the current phase of the interference signal may become more accurate. Furthermore, a relatively less time is taken for the feedback current to be incorporated into the light source 110 because the size of the feedback current increases. In order to achieve the aforementioned effect, the error integrator 170 is disposed, and the second amplifier 160 receives the adjusted voltage signal (the phase of the interference signal).

As illustrated in FIGS. 2A and 2B, the error integrator 170 includes an operational amplifier 410 and a switch 420.

An adjusted voltage signal from the second amplifier 160 is applied as an input voltage Vin of the operational amplifier 410. A resistor $R_1$ is disposed at an input stage of the operational amplifier 410. A capacitor $C_1$ is connected to the input stage in a negative feedback form. The operational amplifier 410 performs an operation as an inverting amplifier.

In this case, the switch 420 is connected to the capacitor in parallel. The on/off of the switch is adjusted depending on whether a reset signal will be received from the control unit (not illustrated). When the switch 420 becomes on (or short), impedance across the input stage and output stage of the operational amplifier 410 becomes 0. Accordingly, the output of the operational amplifier 410 becomes 0. On the contrary, when the switch 420 becomes off (or open), impedance across the input stage and output stage of the operational amplifier 410 is applied by the size of the capacitor $C_1$. Accordingly, the operational amplifier 410 performs an operation as an inverting amplifier.

The operational amplifier 410 operates to accumulate an error because the operational amplifier includes the capacitor as described above. As the operational amplifier 410 operates to accumulate an error, the aforementioned effect may be achieved because the size of a phase error may increase.

Referring back to FIG. 1, the phase error detection unit 180 detects a phase difference between a voltage signal (the phase of an interference signal) that has undergone the error integrator 170 and an offset current value. In this case, the offset current value means a current value that enables a laser output by the light source 110 to have a designed frequency. That is, the offset current value has the frequency of the laser that is required when an error does not occur. The phase error detection unit 180 detects a phase difference between the voltage signal that has undergone the error integrator 170 and the offset current value.

The driving driver 190 applies a current to drive the light source 110 to the light source 110 under the control of the control unit (not illustrated). The control unit (not illustrated) adjusts the frequency of a laser that is output so that the frequency of the laser is close to a designed frequency by considering the results of the detection of the phase error detection unit 180. To this end, the control unit (not illustrated) adjusts the value of the current that is applied to the light source 110 so that the frequency of the laser that is output becomes close to the designed frequency. The driving driver 190 applies the adjusted current to the light source 110 under the control of the control unit (not illustrated).

The control unit (not illustrated) controls an operation of each component within the laser generation apparatus 100.

The control unit (not illustrated) controls the aforementioned operations of the light source 110, the temperature adjustment unit 145, the first amplifier 150, the second amplifier 160, and the phase error detection unit 180.

The control unit (not illustrated) controls an operation of the error integrator 170. The control unit (not illustrated) controls the output of the error integrator 170 by controlling whether to apply a reset signal to the error integrator 170. If the control unit (not illustrated) applies the reset signal to the error integrator 170 as described above, the error integrator 170 outputs 0 V as an output voltage without performing an integration operation. In contrast, if the control unit (not illustrated) does not apply the reset signal to the error integrator 170, the error integrator 170 outputs an output voltage that complies with an integration operation by performing the integration operation. If the laser generation apparatus 100 operates for the first time, the control unit (not illustrated) applies the reset signal to the error integrator 170 for a preset time.

If an error value that is applied to the error integrator 170 for the first time is excessively great, there is a problem in that accuracy is reduced because the error value that is accumulated becomes excessively smaller than the first value and an operation for the size of a feedback current becomes more sensitive and fine. In general, such a problem occurs when the laser generation apparatus 100 operates for the first time. The laser generation apparatus 100 has a constant temperature (e.g., several tens of ° C.) with being rarely affected by a temperature of a surrounding environment if the laser generation apparatus has operated for a sufficient time. In contrast, if the laser generation apparatus 100 has operated for the first time, the laser generation apparatus is greatly affected by a temperature of a surrounding environment. A change in the temperature affects the frequency of a laser that is output by the light source 110. Accordingly, if the error integrator 170 performs an integration operation at timing at which the laser generation apparatus 100 operates for the first time, an error value that is excessively great is applied to the error integrator 170 from the beginning.

In order to prevent such a problem, the control unit (not illustrated) applies a reset signal to the error integrator 170 for a preset time from timing at which the laser generation apparatus 100 operates for the first time. In this case, the preset time is different depending on a temperature of a surrounding environment of the laser generation apparatus 100, and may be several seconds to several minutes. When a difference between a temperature when the laser generation apparatus 100 is stabilized while operating and a temperature of a surrounding environment is relatively great, the preset time relatively increases. When the difference between the temperatures is relatively small, the preset time relatively decreases.

The control unit (not illustrated) controls an operation of the driving driver 190. The frequency of a laser that is output by the light source 110 is different depending on a change in the size of a current that is applied. When a phase error value is received from the phase error detection unit 180, the control unit (not illustrated) controls the driving driver 190 so that the frequency of the laser that is output the light source 110 is identical with a designed frequency by analyzing the phase error value, as illustrated in FIG. 4.

Figure 4:
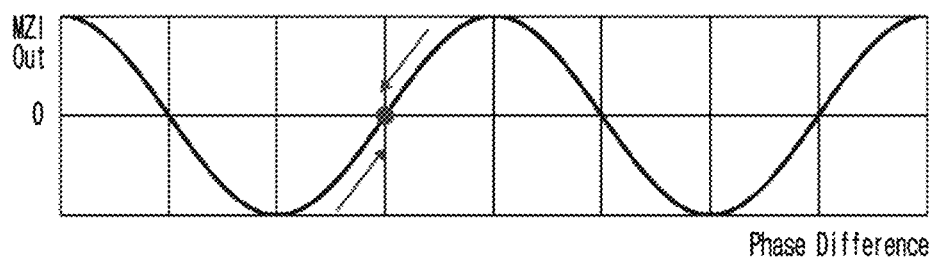
FIG. 4 is a graph illustrating an example of a waveform that is detected by a phase error detection unit according to an embodiment of the present disclosure.

FIG. 4 is a graph illustrating an example of a waveform that is detected by a phase error detection unit according to an embodiment of the present disclosure.

Referring to FIG. 4, the control unit (not illustrated) controls the driving driver 190 so that a phase error value of the light source 110, which is required to output a laser having a designed frequency, is identical with a phase error value detected by the phase error detection unit 180 by comparing the phase error value of the light source 110, which is required to output the laser having the designed frequency, and the phase error value detected by the phase error detection unit 180. The control unit (not illustrated) may adjust the frequency of the laser that is output by the light source 110 by adjusting the size of a current that is applied by the driving driver 190.

The laser generation apparatus 100 can accurately measure and stabilize frequency characteristics of a laser that will oscillate even through a simple structure because laser generation apparatus includes each component that performs the aforementioned operation.

The above description is merely a description of the technical spirit of the present embodiment, and those skilled in the art may change and modify the present embodiment in various ways without departing from the essential characteristic of the present embodiment. Accordingly, the embodiments should not be construed as limiting the technical spirit of the present embodiment, but should be construed as describing the technical spirit of the present embodiment. The technical spirit of the present embodiment is not restricted by the embodiments. The range of protection of the present embodiment should be construed based on the following claims, and all of technical spirits within an equivalent range of the present embodiment should be construed as being included in the scope of rights of the present embodiment.

What is claimed is:

1. A laser generation apparatus comprising:
a light source configured to make oscillate a laser having a frequency that complies with an amount of current, based on the amount of the current that is applied thereto;
a splitter configured to ramify a laser that is incident thereon at a preset ratio;
an interference system configured to receive the ramified laser from the splitter, to generate an interference signal by ramifying a laser that is incident thereon, and to measure a phase of a laser that has oscillated;
a temperature adjustment unit configured to uniformly maintain a temperature of a part of the interference system;
an error integrator configured to receive a signal that has undergone the interference system and to accumulate a phase error that has occurred;
a phase error detection unit configured to detect a phase difference between the signal that has undergone the error integrator and an offset current value;
a driving driver configured to apply a current to drive the light source to the light source; and
a control unit configured to control an operation of each component within the laser generation apparatus and to control the driving driver based on results of the detection of the phase error detection unit,
wherein the splitter outputs some of the laser that is incident thereon to an outside and advances remaining laser toward the interference system,
the error integrator comprises:
an operational amplifier having a resistor disposed at an input stage thereof and having a capacitor connected thereto in a negative feedback form; and
a switch connected to the capacitor in parallel and having an on/off adjusted depending on whether a reset signal is to be applied by the control unit,
the operational amplifier increases a size of a phase error while accumulating an error through the capacitor included in the operational amplifier, and
as the size of the phase error increases, a difference between a reference value for solving the phase error and a size of a feedback current according to a phase of the interference signal becomes relatively more accurate, and a relatively less time is taken for the feedback current to be incorporated into the light source.

2. The laser generation apparatus of claim 1, further comprising an isolator disposed between the splitter and the light source on a light path and configured to prevent the laser that is made to oscillate by the light source from being reflected back to the light source.

3. The laser generation apparatus of claim 1, wherein the preset ratio is 99:1 on the basis of the laser that is output to the outside and a laser that proceeds to the interference system.

4. The laser generation apparatus of claim 1, wherein the interference system is implemented as a Mach-Zender interference system.

5. The laser generation apparatus of claim 4, wherein the interference system more delays any one path, among paths through which the ramified lasers are to pass, than other paths.

6. The laser generation apparatus of claim 5, wherein the temperature adjustment unit uniformly maintains a temperature of a portion that has been more delayed than another path within the interference system.

7. The laser generation apparatus of claim 6, wherein the temperature adjustment unit is disposed to come into contact with a part of the interference system or disposed within a set radius of the interference system.

8. The laser generation apparatus of claim 1, further comprising a first amplifier configured to receive an electrical signal that is output by the interference system and to convert the electrical signal into a voltage signal.

9. The laser generation apparatus of claim 8, further comprising a second amplifier configured to receive the voltage signal converted by the first amplifier and to adjust a gain of a circuit within the laser generation apparatus.

* * * * *